(12) United States Patent
Otsuka

(10) Patent No.: US 6,449,192 B2
(45) Date of Patent: Sep. 10, 2002

(54) PROGRAMMABLE READ-ONLY MEMORY GENERATING IDENTICAL WORD-LINE VOLTAGES FROM DIFFERENT POWER-SUPPLY VOLTAGES

(75) Inventor: Masayuki Otsuka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/860,522

(22) Filed: May 21, 2001

(30) Foreign Application Priority Data

Jun. 16, 2000 (JP) ........................................ 2000-181018

(51) Int. Cl.⁷ .............................................. G11C 16/06
(52) U.S. Cl. ............................ 365/185.23; 365/230.06; 327/106
(58) Field of Search ....................... 365/185.23, 230.06; 326/106

(56) References Cited

U.S. PATENT DOCUMENTS 4,737,936 A * 4/1988 Takeuchi .................... 326/106

* cited by examiner

Primary Examiner—Huan Hoang
(74) Attorney, Agent, or Firm—Volentine Francos, PLLC

(57) ABSTRACT

A programmable read-only memory supplied with power at a specified voltage has word-line drivers that drive the word lines of the memory-cell array to the same potential, regardless of whether the specified voltage has a first value or a second value. This effect is achieved by using different types of transistors to drive the word lines, depending on the specified voltage. As a result, the same memory-cell array, the same programming voltages, and the same wafer process can be used for memories operating at either of the two specified voltage values. Consequently, less time and effort are needed to design memories for different power-supply voltages.

19 Claims, 3 Drawing Sheets

PROGRAMMABLE READ-ONLY MEMORY GENERATING IDENTICAL WORD-LINE VOLTAGES FROM DIFFERENT POWER-SUPPLY VOLTAGES

BACKGROUND OF THE INVENTION

The present invention relates to an electrically programmable read-only memory.

An electrically programmable read-only memory is commonly referred to as an EPROM or PROM, the latter term being used below. PROMs are fabricated in large numbers on semiconductor wafers, and are widely used in electronic computing devices for the storage of fixed data and programs.

There is no single standard power-supply voltage for electronic computing devices. Many operate on a five-volt (5-V) supply, but others operate on a lower-voltage supply such as a three-volt (3-V) supply. A PROM manufacturer normally provides different PROM versions specified for operation at different power-supply voltages. The different versions conventionally have the same circuit design, but differ in their wafer process parameters and programming parameters. For example, to ensure reliable operation, the thicknesses of oxide films deposited during the wafer process must be adjusted according to the power-supply voltage, and the programming voltage and the internal cell voltage used during programming must be optimized for each power-supply voltage. Optimization of these programming parameters is particularly difficult, requiring much time and labor in the design and development stage.

SUMMARY OF THE INVENTION

An object of the present invention is to provide a PROM having two different versions, specified for operation at two different power-supply voltages, both versions being manufactured with the same wafer process parameters and programmed with the same programming parameters.

An attendant object of the invention is to reduce PROM design and development costs.

Another object is to shorten PROM design and development time.

The invented PROM operates in a program mode and a read mode on a power supply. Either a first power-supply voltage or a second power-supply voltage is specified when the PROM is manufactured. The PROM has word lines, bit lines, memory cells, an address decoder, and word-line drivers. When selected by the address decoder, a word-line driver drives a word line to a potential that selects the memory cells disposed on the word line. The selected memory cells are programmed with data from the bit lines in the program mode, and supply the programmed data to the bit lines in the read mode.

The invention employs a method of driving the word lines in which a field-effect transistor of one type is used if the first power-supply voltage is specified, and a field-effect transistor of another type is used if the second power-supply voltage is specified. Both methods drive the word lines to the first power-supply voltage. The two transistors are, for example, a p-channel transistor and an n-channel transistor, or a depletion-mode transistor and an enhancement-mode transistor.

In a first aspect of the invention, each word-line driver includes a first node, a second node, four transistors, and a wiring pattern that can be configured in different ways by a fabrication mask option. The first node is coupled through the first transistor to the power supply, through the second transistor to ground, and by the wiring pattern to the second node if the first power-supply voltage is specified. The first and second nodes are mutually disconnected if the second power-supply voltage is specified. The second node is coupled through the third transistor to the power supply. The first node is coupled through the fourth transistor to a word line. The substrate of the first transistor is grounded.

In the read mode, a word line is driven through the second and fourth transistors or the first and fourth transistors, depending on the power-supply voltage specification. The grounded substrate of the first transistor provides a body effect that results in the word line being driven to the same potential in both cases.

In a second aspect of the invention, each word-line driver includes a transistor that supplies a decoded address signal to a word line, and a logic circuit that turns the transistor on and off according to the decoded address signal and the operating mode. The transistor is a depletion-mode transistor if the first power-supply voltage is specified, and an enhancement-mode transistor if the second power-supply voltage is specified.

In a third aspect of the invention, each word-line driver includes a transistor that supplies a decoded address signal to a word line, and a wiring circuit that supplies either a control signal or a predetermined potential to the gate electrode of the transistor, depending on the power-supply specification. The transistor is a depletion-mode transistor if the first power-supply voltage is specified, and an enhancement-mode transistor if the second power-supply voltage is specified.

In the second and third aspects of the invention, in the read mode, the enhancement-mode transistor used with the second power-supply voltage turns off when the word line reaches substantially the first power-supply voltage, so the selected word line is driven to substantially the first power-supply voltage regardless of which power-supply voltage is used.

In all aspects of the invention, since the word lines are driven to substantially the same potential regardless of which power-supply voltage is used, the PROM can be programmed with the same programming voltage for both power-supply voltages, and the same wafer process can be used for both power-supply voltages.

DETAILED DESCRIPTION OF THE INVENTION

Figure 1:
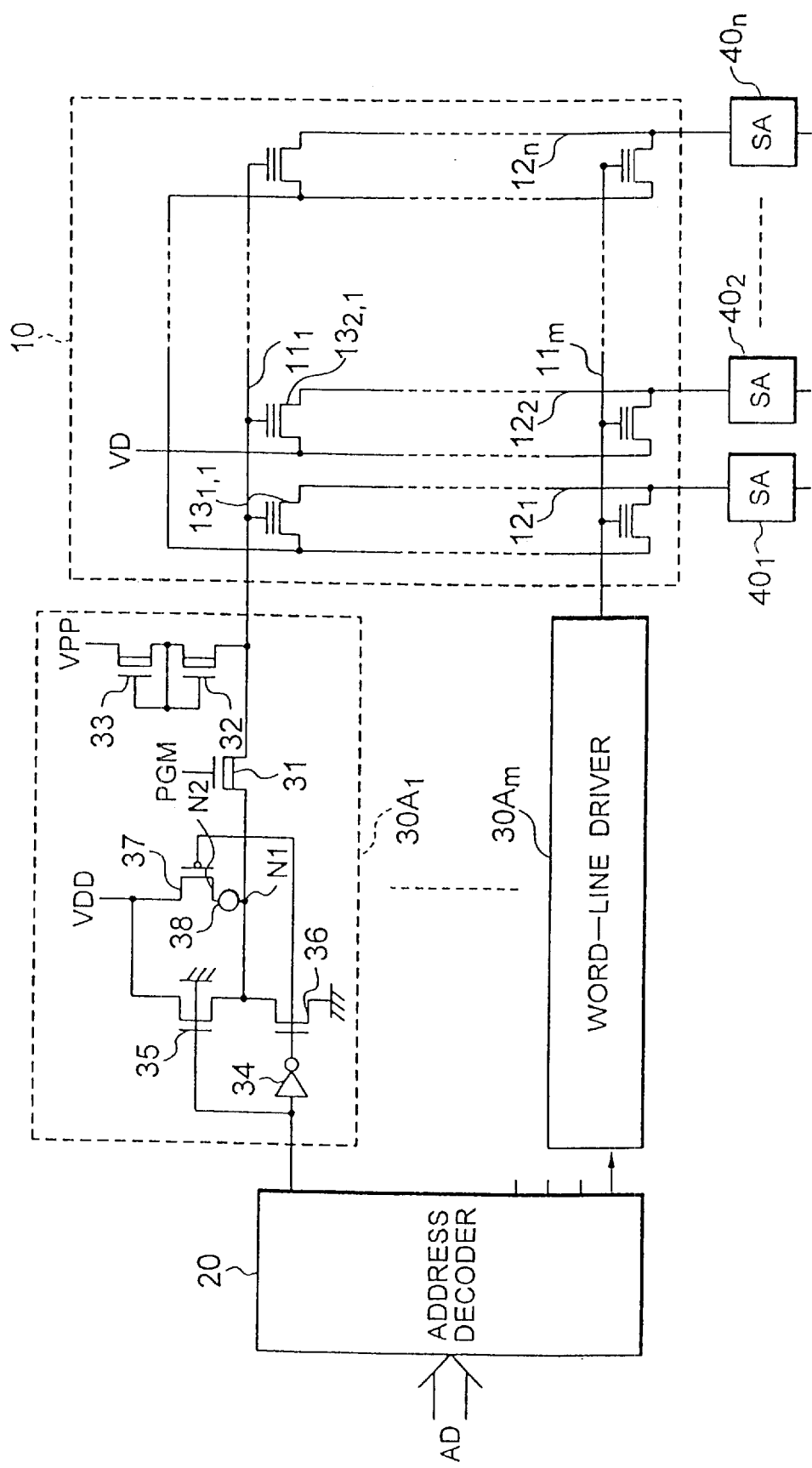
FIG. 1 is a circuit diagram illustrating a first embodiment of the invention.

PROMs embodying the invention will be described with reference to the attached drawings, in which like parts are indicated by like reference characters.

In the descriptions, a metal-oxide-semiconductor field-effect transistor will be referred to as a MOS transistor.

Among the various MOS transistor types, an n-channel enhancement-mode MOS transistor will be referred to as an NMOS transistor, a p-channel enhancement-mode MOS transistor will be referred to as a PMOS transistor, and an n-channel depletion-mode MOS transistor will be referred to as a DMOS transistor. Each of these types of transistor has a source electrode, a gate electrode, a drain electrode, and a substrate electrode. The substrate electrode is normally biased at a fixed potential. The source and drain designations are interchangeable. In an n-channel transistor, for example, if the source and drain electrodes are at different potentials, the electrode at the lower potential functions as the source electrode.

The relevant properties of these transistors are that an NMOS transistor turns on when its gate-source voltage rises above a certain positive threshold value, a PMOS transistor turns on when its gate-source voltage falls below a certain negative threshold value, and a DMOS transistor turns off when its gate-source voltage falls below a certain negative threshold value. There is also a body effect that causes the threshold voltage of an NMOS transistor to rise as its source-substrate voltage rises.

Referring to FIG. 1, the first embodiment of the invention is a PROM having a memory-cell array 10 with m word lines $11_i$ (i=1 to m) and n bit lines $12_j$ (j=1 to n), where m and n are arbitrary positive integers. Memory cells $13_{i,j}$ are disposed at the intersections of the bit lines and word lines. Each memory cell $13_{i,j}$ comprises a MOS transistor having a floating gate and a control gate. The control gate is coupled to the corresponding word line $11_i$, the source electrode of the transistor is coupled to the corresponding bit line $12_j$, and the drain electrode of the transistor is coupled to a node that supplies a cell voltage VD.

The PROM also has an address decoder 20 that receives and decodes an address signal AD to generate decoded address signals that select the word lines $11_i$ individually. These decoded address signals are supplied to respective word-line drivers $30A_i$ (i=1 to m), and can be regarded as selecting the word-line drivers.

Each word-line driver $30A_i$ comprises DMOS transistors 31, 32, 33, an inverter 34, NMOS transistors 35, 36, a PMOS transistor 37, and a wiring pattern 38. The decoded address signal is supplied to the inverter 34 and the gate electrode of NMOS transistor 35. The inverted signal produced by the inverter 34 is supplied to the gate electrodes of NMOS transistor 36 and PMOS transistor 37. NMOS transistor 35 has its source electrode coupled to a first internal node N1, its drain electrode coupled to a power supply node, generically denoted VDD, and its substrate electrode coupled to ground. NMOS transistor 36 has its source electrode coupled to ground and its drain electrode coupled to node N1. PMOS transistor 37 has its source electrode coupled to the power supply VDD and its drain electrode coupled to a second internal node N2. The wiring pattern 38 is disposed between nodes N1 and N2.

The source and drain electrodes of DMOS transistor 31 are coupled in series between node N1 and word line $11_i$. A program mode control signal PGM (active low) is supplied to the gate electrode of this DMOS transistor 31.

DMOS transistors 32, 33 are coupled in series between a programming power supply, generically denoted VPP, and word line $11_i$. The source electrode of DMOS transistor 32 is coupled to word line $11_i$, the drain electrode of DMOS transistor 32 is coupled to the source electrode of DMOS transistor 33, and the drain electrode of DMOS transistor is coupled to VPP. The gate electrodes of DMOS transistors 32, 33 are both coupled to the source electrode of DMOS transistor 33 and the drain electrode of DMOS transistor 32. DMOS transistors 32, 33 have a comparatively high series resistance and function as pull-up transistors.

The PROM also has n sense amplifiers $40_j$ (j=1 to n) which are coupled to respective bit lines $12_j$. The sense amplifiers detect data on the bit lines in the read mode, and supply data to the bit lines in the program mode.

The configuration of the wiring pattern 38 is determined by a mask used in the PROM fabrication process. There are two mask options, one causing the wiring pattern 38 to interconnect nodes N1 and N2, the other leaving nodes N1 and N2 mutually disconnected. The mask option that interconnects nodes N1 and N2 is selected if the PROM is specified for use at a first power-supply voltage VDD of three volts (3 V). The mask option that does not interconnect nodes N1 and N2 is selected if the PROM is specified for use at a second power-supply voltage VDD of five volts (5 V). Thus there are two versions of the first embodiment, referred to below as the three-volt version and the five-volt version.

The operation of these two versions in the read mode and the program mode will be described below.

First, the programming of the three-volt version will be described. Nodes N1 and N2 are interconnected through the wiring pattern 38, as explained above. The power-supply voltage VDD is 3 V, the programming voltage VPP is 9.75 V, the cell voltage VD is 6 V, and the program mode control signal PGM is low (0 V). All memory cells $13_{i,j}$ originally hold '1' data.

To program the memory cells on a particular word line $11_i$, the data to be programmed are set in the sense amplifiers $40_j$ (j=1 to n), and an address signal AD is supplied to the address decoder 20, causing the address decoder 20 to send a high (VDD) decoded address signal to the selected word-line driver $30A_i$ and low (0-V) decoded address signals to the other word-line drivers. In the selected word-line driver $30A_i$, NMOS transistor 35 and PMOS transistor 37 are placed in the on-state, while NMOS transistor 36 is in the off-state. Since nodes N1 and N2 are interconnected, node N1 receives VDD through PMOS transistor 37, as well as through NMOS transistor 36. The potential of node N1 rises from the ground level toward VDD. As the potential of node N1 approaches VDD, the gate-source voltage of NMOS transistor 35 approaches zero and thus falls below the threshold level, turning NMOS transistor 35 off, but the gate-source voltage of PMOS transistor 37 remains fixed (at -VDD), so node N1 continues to receive VDD through PMOS transistor 37. Thus the potential of node N1 is brought to substantially the VDD level.

DMOS transistor 31 is initially in the on-state, so as the potential of node N1 rises, the potential of word line $11_i$ also rises. As these potentials rise, however, DMOS transistor 31 acquires a sufficiently negative gate-source voltage to turn off, isolating word line $11_i$ from node N1. That allows the potential of word line $11_i$ to be pulled up further, to VPP.

The pull-up function is performed by DMOS transistors 32 and 33. These transistors are initially in the on-state and stay in the on-state, their gate-source voltages remaining positive or zero, as the potential of word line $11_i$ rises to VPP. The control gates of the memory cells $13_{i,j}$ connected to word line $11_i$ are thus brought to substantially the VPP level (j=1 to n).

The bit lines $12_j$ coupled to sense amplifiers $40_j$ holding '0' data are at ground level. The potential difference between VPP and ground is large enough to inject electrons into the floating gates of the corresponding memory cells $13_{i,j}$, raising the threshold voltages of these memory cells. The bit lines $12_j$ coupled to sense amplifiers $40_j$ holding '1' data are at the VD potential. The potential difference between VPP and VD is not large enough for electron injection to take place.

In the non-selected word line drivers $30A_k$ (k≠i), NMOS transistor 36 is in the on-state while NMOS transistor 35 and PMOS transistor 37 are in the off-state. Node N1 is therefore at the ground potential. Since the program mode control signal PGM is low, both the source and gate electrodes of DMOS transistor 31 are at the ground potential, so DMOS transistor 31 is in the on-state, and holds word line $11_k$ at substantially the ground level. The actual word-line level is slightly higher than ground, because DMOS transistors 32 and 33 are also in the on-state, but the comparatively high series resistance of these DMOS transistors prevents the word line $11_k$ from being pulled up high enough to cause electron injection in the connected memory cells $11_{k,j}$.

Next, the reading of the three-volt version of the PROM will be described. In the read mode the program mode control signal PGM is high (3 V), the cell voltage VD is 1.2 V, and the programming voltage VPP is not supplied.

When the memory cells coupled to word line $11_i$ are read, an address signal AD is supplied to the address decoder 20, causing the address decoder 20 to send a high (VDD) decoded address signal to word-line driver $30A_i$ and low (0-V) decoded address signals to the other word-line drivers. In the selected word-line driver $30A_i$, node N1 is brought to substantially the VDD level as described above. The gate potential of DMOS transistor 31 is also VDD, so DMOS transistor 31 is in the on-state, and the potential of word line $11_i$ rises to substantially VDD. Since the programming power supply VPP is off, the word-line potential may be pulled down slightly through DMOS transistors 32 and 33, but the series resistance of these transistors is high enough that the resulting potential drop can be ignored.

The control gates of the memory cells $13_{i,j}$ connected to word line $11_i$ are thus driven to substantially VDD (j=1 to n). The transistors in the memory cells $13_{i,j}$ that have been programmed with '0' data have threshold voltages higher than VDD (3 V) and remain off; the transistors in the memory cells $13_{i,j}$ that have not been programmed with '0' data have threshold voltages lower than VDD and turn on, conducting current from VD to the corresponding sense amplifiers $40_j$. The sense amplifiers sense the presence or absence of current, thereby sensing the programmed data.

Next, the programming of the five-volt version will be described. The power-supply voltage VDD is 5 V, the programming voltage VPP is again 9.75 V, and the cell voltage VD is again 6 V, but nodes N1 and N2 are not interconnected. PMOS transistor 37 therefore plays no part in the programming operation.

To program the memory cells on word line $11_i$, the program mode control signal PGM is driven low, the data to be programmed are set in the sense amplifiers $40_j$ (j=1 to n), and an address signal AD is supplied to the address decoder 20, causing the address decoder 20 to send a high (5-V) decoded address signal to word-line driver $30A_i$ and low (0-V) decoded address signals to the other word-line drivers. In the selected word-line driver $30A_i$, NMOS transistor 35 is thereby placed in the on-state and NMOS transistor 36 is placed in the off-state. As the potential of node N1 rises, the gate-source voltage of NMOS transistor 35 decreases. The threshold voltage of NMOS transistor 35 also increases, due to a considerable body effect, since the substrate of this transistor is at the ground potential. The body effect is such that NMOS transistor 35 stops conducting when node N1 reaches a potential of substantially three volts (3 V).

Programming then proceeds as in the three-volt version, with DMOS transistor 31 in the off-state because its gate-source voltage is substantially minus three volts (−3 V). Word line $11_i$ is pulled up to VPP.

Next, the reading of the five-volt version will be described. The program mode control signal PGM is high (5 V), the cell voltage VD is 1.2 V, and the programming voltage VPP is not supplied.

When the memory cells coupled to word line $11_i$ are read, an address signal AD is supplied to the address decoder 20, causing the address decoder 20 to send a high (5-V) decoded address signal to word-line driver $30A_i$ and low (0-V) decoded address signals to the other word-line drivers. In the selected word-line driver $30A_i$, node N1 is brought to a potential of substantially three volts (3 V) as described in the five-volt programming operation. DMOS transistor 31 is in the on-state because its gate potential is high (5 V), and the potential of word line $11_i$ rises to the potential of node N1 (substantially 3 V). The series resistance of DMOS transistors 32 and 33 is high enough that the pull-down effect of these transistors can be ignored. The control gates of the memory cells $13_{i,j}$ connected to word line $11_i$ are thus driven to a potential of substantially three volts (j=1 to n). The data stored in the memory cells $13_{i,j}$ are sensed by the sense amplifiers $40_j$ as described above.

The first embodiment functions equally well at power-supply voltages of three and five volts, because the voltages supplied to the memory-cell array 10 are the same in both cases. The same wafer process, the same cell voltage VD, and the same programming voltage VPP can accordingly be used for both the three-volt and the five-volt versions of the first embodiment. The two versions are therefore obtained at substantially the design and development cost of only one version. The design and development of both versions can be completed in about the same length of time as required for just one version.

Figure 2:
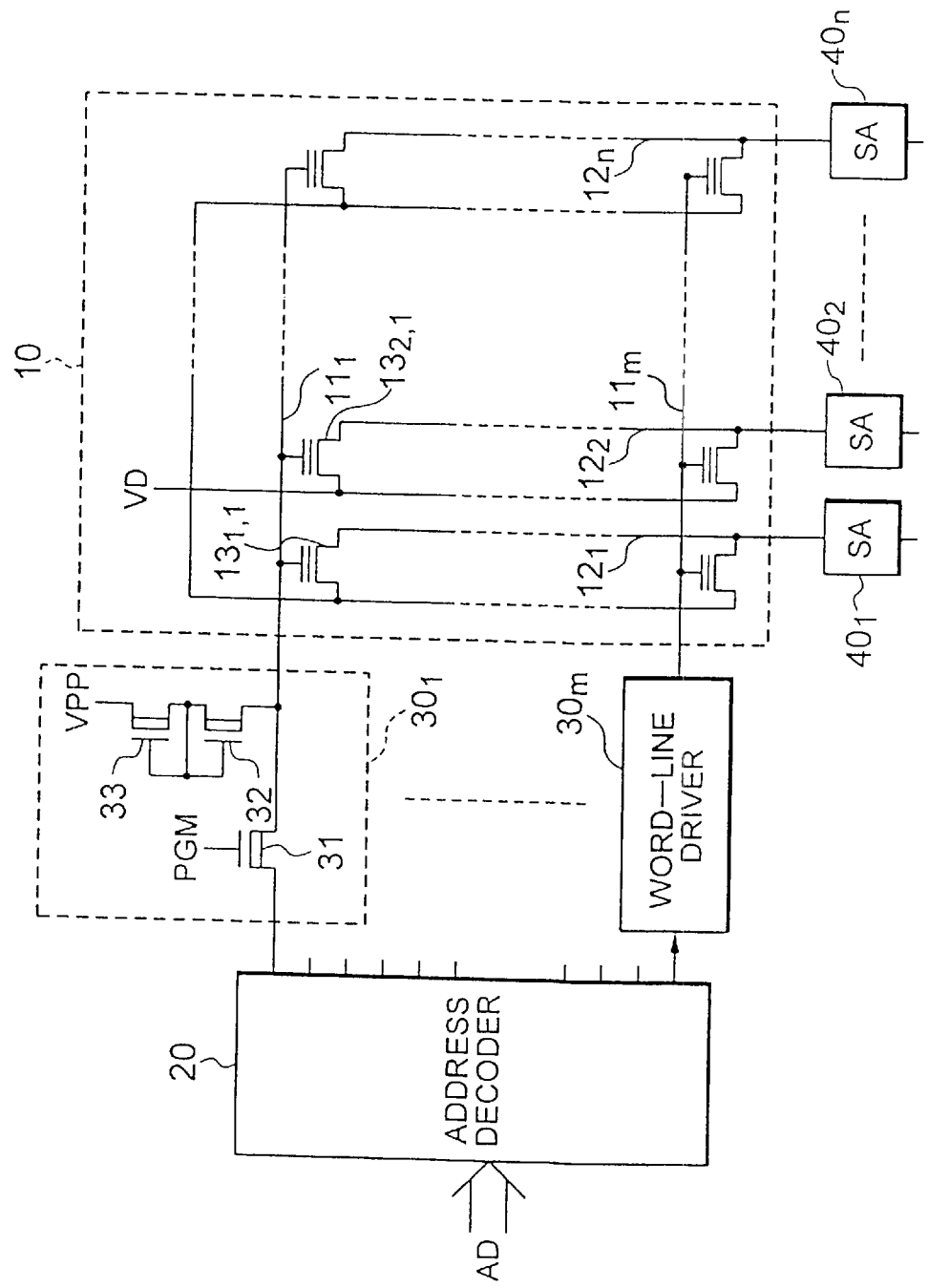
FIG. 2 is a circuit diagram illustrating a conventional PROM.

For comparison, FIG. 2 shows a conventional PROM in which each word line driver $30_i$ includes DMOS transistors 31, 32, 33 as described above, but lacks the PMOS and NMOS transistors of the first embodiment. When this PROM is read, in the selected word-line driver $30_i$, DMOS transistor 31 turns on and conducts the voltage (VDD) output by the address decoder 20 to the selected word line $11_i$. The control gates of the memory cells on this word line $11_i$ are thus placed at different potentials, depending on whether VDD is three or five volts. For reliable operation at the higher (5-V) power-supply voltage, more electrons must be injected into the floating gates during programming than for the lower (3-V) power-supply voltage. Different programming voltages (VPP) and different cell voltages (VD) must therefore be used, depending on the power-supply voltage, and fabrication parameters such as gate oxide thicknesses of the memory-cell transistors must also be adjusted to allow for the different voltages.

The three-volt and five-volt versions of the conventional PROM must therefore be designed separately, and a separate wafer process must be developed for each. The concomitant design and development costs are considerably higher than for the first embodiment, and additional design and development time is required.

Figure 3:
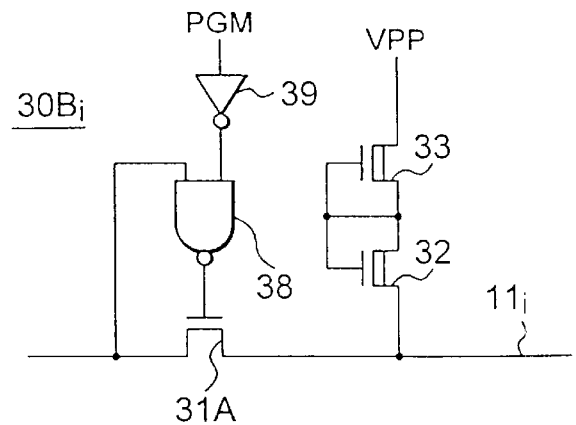
FIG. 3 is a circuit diagram of a word-line driver in a second embodiment of the invention.

A second embodiment of the invention comprises the memory-cell array 10, address decoder 20, and sense amplifiers $40_j$ described in the first embodiment, and the word-line drivers $30B_i$ shown in FIG. 3, which replace the word-line drivers $30A_i$ of the first embodiment.

Each word-line driver 30B$_i$ has a transistor 31A of a selectable type coupled in series between the address decoder (not visible) and word line 11$_i$. When turned on, transistor 31A conducts a decoded address signal to word line 11$_i$. Transistor 31A is a DMOS transistor in the three-volt version of the second embodiment, and an NMOS transistor in the five-volt version. The word-line driver 30B$_i$ also comprises pull-up DMOS transistors 32, 33 as described in the first embodiment, a NAND gate 38, and an inverter 39. The program mode control signal PGM is supplied to the inverter 39. The NAND gate 38 receives the inverted control signal output by the inverter 39, and the decoded address signal output by the address decoder. The output terminal of the NAND gate 38 is coupled to the gate electrode of transistor 31A.

In the program mode (PGM low), in the selected word-line driver 30B$_i$, both inputs to the NAND gate 38 are high, so the gate electrode of transistor 31A is at the low (ground) level. As the potential of word line 11$_i$ rises, the gate-source voltage of transistor 31A becomes negative, causing transistor 31A to turn off, regardless of whether transistor 31A is of the DMOS or NMOS type. Word line 11$_i$ is then pulled up to the VPP level through DMOS transistors 32 and 33. Conversely, in the non-selected word-line drivers, since the decoded address signal supplied to the NAND gate 38 is low, the gate electrode of transistor 31A is at the high level, transistor 31A is in the on-state, regardless of whether it is of the DMOS or NMOS type, and word line 11$_i$ is held at the low (ground) level.

In both versions of the second embodiment, accordingly, the selected word line is raised to the VPP level while other word lines are held at ground level, and programming is carried out as described in the first embodiment.

In the read mode (PGM high, VPP not supplied), since the output of inverter 39 is low, the logic output of NAND gate 38 is high (VDD) and the gate electrode of transistor 31A is held at the VDD level. The three-volt and five-volt versions are read as follows.

In the three-volt PROM version, since transistor 31A is a DMOS transistor, it is in the on-state regardless of whether the decoded address signal is high (3 V) or low (0 V). The decoded address signal is conducted to word line 11$_i$ with substantially no voltage drop. The selected word line is thus brought to a 3-V potential, while the non-selected word lines are held at the ground potential.

In the five-volt version, transistor 31A is an NMOS transistor and remains in the on-state only as long as its gate potential exceeds its source potential by at least the necessary threshold voltage. In the selected word-line driver 30B$_i$, the electrode coupled to the word line 11$_i$ functions as the source electrode while the electrode receiving the high (5-V) decoded address signal functions as the drain electrode. NMOS transistor 31A is initially in the on-state, but turns off as the potential of the word line 11$_i$ rises, the turn-off being completed when the word-line potential is substantially three volts. In non-selected word-line drivers, the electrode receiving the low (0 V) decoded address signal functions as the source electrode, so NMOS transistor 31A remains in the on-state and the word-line potential is held at ground level.

In the read mode, accordingly, in both the three-volt and five-volt versions, the selected word line is driven to substantially three volts (3 V) while non-selected word lines are held at ground level. The same memory-cell array and the same programming voltages can therefore be used for both the three-volt and five-volt versions, saving design and development time and cost. The wafer process is also the same for both versions, although different masks are used to produce DMOS transistors 31A in the three-volt version and NMOS transistors 31A in the five-volt version.

Figure 4:
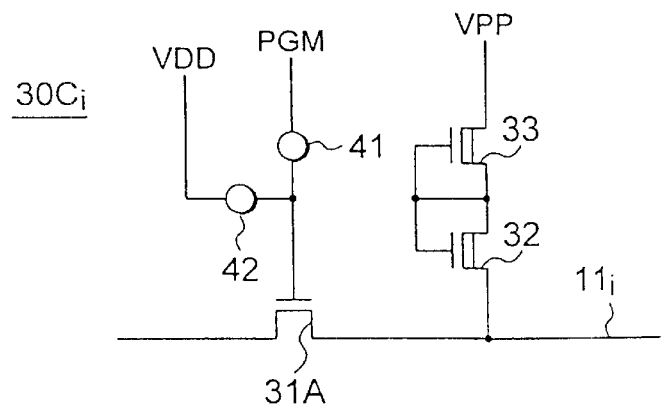
FIG. 4 is a circuit diagram of a word-line driver in a third embodiment of the invention.

A third embodiment of the invention comprises the memory-cell array 10, address decoder 20, and sense amplifiers 40$_j$ described in the first embodiment, and the word-line drivers 30C$_i$ shown in FIG. 4, which replace the word-line drivers 30A$_i$ of the first embodiment.

Each word-line driver 30C$_i$ comprises the DMOS or NMOS transistor 31A described in the second embodiment, the pull-up DMOS transistors 32, 33 described in the first embodiment, a wiring pattern 41 through which the program mode control signal PGM is supplied to the gate electrode of transistor 31A, and another wiring pattern 42 that couples the gate electrode of transistor 31A to the power supply VDD. The wiring patterns 41, 42 are continuous or open as selected by mask options in the fabrication process. In the three-volt version of the third embodiment, wiring pattern 41 is continuous and wiring pattern 42 is open. In the five-volt version, wiring pattern 41 is open and wiring pattern 42 is continuous.

In the three-volt version of the PROM, transistor 31A is a DMOS transistor, and its gate electrode receives the program mode control signal PGM through wiring pattern 41.

In the three-volt program mode (PGM low), the DMOS transistor 31A in the selected word-line driver 30C$_i$ receives a 3-V decoded address signal from the address decoder. As the potential of word line 11$_i$ rises, DMOS transistor 31A turns off because its gate electrode is at the ground potential. Word line 11$_i$ is then pulled up to the VPP potential through DMOS transistors 32 and 33. In the non-selected word-line drivers, the decoded address signal is low (0 V), DMOS transistor 31A is held in the on-state because its source and gate electrodes are both at ground level, and the word line is held at ground level.

In the three-volt read mode (PGM high, VPP not supplied), DMOS transistor 31A is always in the on-state because its gate potential (PGM=VDD) is equal to or greater than its source potential (VDD or ground). The word lines are therefore brought to the potentials of the corresponding decoded address signals. The selected word line 11$_i$ is driven to the VDD level (3 V), while other word lines are held at ground level.

In the five-volt version of the PROM, transistor 31A is an NMOS transistor, and its gate electrode is tied to VDD (5 V).

In the five-volt program mode, NMOS transistor 31A in the selected word-line driver 30C$_i$ receives a 5-V (VDD) decoded address signal from the address decoder. As the potential of word line 11$_i$ rises toward 5 V, the gate-source voltage of NMOS transistor 31A approaches zero, NMOS transistor 31A turns off, and word line 11$_i$ is pulled up to the VPP level through DMOS transistors 32, 33. In the non-selected word-line drivers, the source electrode of NMOS transistor 31A receives a low (0-V) decoded address signal from the address decoder while its gate electrode is at VDD, so NMOS transistor 31A is in the on-state and the word line is held at ground level.

In the five-volt read mode (VPP not supplied), the source electrode of NMOS transistor 31A in the selected word-line driver 30C$_i$ is the electrode coupled to word line 11$_i$. As explained in the second embodiment, NMOS transistor 31A turns off when word line 11$_i$ reaches a potential of substantially three volts (3 V). In the non-selected word-line drivers, the source electrode of NMOS transistor 31A is the electrode receiving zero volts from the address decoder (not visible), so NMOS transistor 31A is in the on-state and the word line is held at ground level (0 V).

In both the three-volt and five-volt versions, the selected word line is driven to the VPP potential in the program mode and to a potential of substantially three volts (3 V) in the read mode, while non-selected word lines are held at ground level in both modes. The same memory-cell array and the same programming voltages can accordingly be used for both the three-volt and five-volt versions, leading to savings in design and development time and cost. The same wafer process is also used for both versions, although with different masks as noted in the second embodiment.

Figure 5:
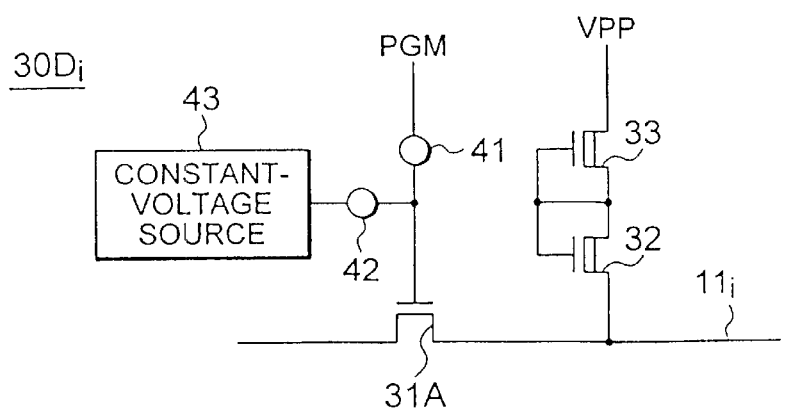
FIG. 5 is a circuit diagram of a word-line driver in a fourth embodiment of the invention.

A fourth embodiment of the invention comprises the memory-cell array 10, address decoder 20, and sense amplifiers $40_j$ described in the first embodiment, and the word-line drivers $30D_i$ shown in FIG. 5, which replace the word-line drivers $30A_i$ of the first embodiment. These word-line drivers $30D_i$ are identical to the word-line drivers $30C_i$ in the third embodiment, except that wiring pattern 42 couples the gate electrode of transistor 31A to a constant-voltage source 43. In the read mode, the constant-voltage source 43 divides the power-supply voltage VDD to generate a predetermined potential MV intermediate between VDD and ground. In the program mode, the constant-voltage source 43 outputs the power-supply voltage VDD.

The same constant-voltage source 43 may be used for all of the word-line drivers $30D_i$. The constant-voltage source 43 includes well-known means such as resistors (not visible) for dividing VDD in the read mode.

The fourth embodiment operates in the same way as the third embodiment, except that in the five-volt version of the PROM, in the read mode, the gate potential of NMOS transistor 31A is at the MV potential instead of the VDD potential. This MV potential is set at a level that makes NMOS transistor 31A turn off when word line $11_i$ reaches a potential of exactly three volts (3 V). In the read mode, accordingly, the selected word line is driven to a potential of three volts (3 V) with high accuracy in both the three-volt and five-volt versions of the PROM.

It is comparatively easy to determine the MV potential level that will make NMOS transistor 31A turn off when the selected word line reaches three volts, and to design a constant-voltage source 43 to generate this MV potential. Compared with the third embodiment, the fourth embodiment thus provides an improved five-volt PROM version at only a small additional design and development cost. As in the third embodiment, the same wafer process can be used for both versions.

The invention has been described in relation to three-volt and five-volt power supplies, but these voltages are of course only examples. The invention can be practiced in a PROM with versions suitable for any two power-supply voltages.

The memory-cell array is not limited to the circuit configuration shown in FIG. 1.

Those skilled in the art will recognize that further variations are possible within the scope claimed below.

What is claimed is:

1. A method of driving a word line in a programmable read-only memory, comprising the steps of:
    using a transistor of a first type to drive the word line from a ground potential to a first potential if the programmable read-only memory has a specified power-supply voltage equal to the first potential; and
    using a transistor of a second type, different from the first type, to drive the word line from the ground voltage to the first voltage if the programmable read-only memory uses a specified power-supply voltage having a second voltage different from the first voltage.

2. The method of claim 1, wherein the transistor of the first type is a p-channel field-effect transistor and the transistor of the second type is an n-channel field-effect transistor.

3. The method of claim 2, further comprising the step of grounding a substrate of the transistor of the second type.

4. The method of claim 2, further comprising the steps of:
    coupling the word line to a node;
    coupling the transistor of the second type to said node;
    coupling the transistor of the first type to said node if the specified power-supply voltage has the first voltage; and
    disconnecting the transistor of the first type from said node if the specified power-supply voltage has the second voltage.

5. The method of claim 1, wherein the transistor of the first type is a depletion-mode field-effect transistor and the transistor of the second type is an enhancement-mode field-effect transistor.

6. The method of claim 5, further comprising the steps of:
    receiving a control signal and a decoded address signal;
    performing a logic operation on the control signal and the decoded address signal, obtaining a logic output signal;
    supplying the logic output signal to a gate electrode of the transistor of the first type if the specified power-supply voltage has the first voltage; and
    supplying the logic output signal to a gate electrode of the transistor of the second type if the specified power-supply voltage has the second voltage.

7. The method of claim 5, further comprising the steps of:
    supplying a control signal to a gate electrode of the transistor of the first type if the specified power-supply voltage has the first voltage, the control signal selecting a program mode and a read mode; and
    supplying a predetermined voltage to a gate electrode of the transistor of the second type if the specified power-supply voltage has the second voltage.

8. A programmable read-only memory receiving power from a power supply having a specified voltage, operating in a program mode and a read mode, having a plurality of word-line drivers, an address decoder that receives and decodes an address signal and selects one of the word-line drivers, and a memory-cell array with word lines, bit lines, and memory cells disposed at intersections of the word lines and bit lines, the selected line driver driving one of the word lines, thus selecting the memory cells thereon, the selected memory cells being programmed with data from the bit lines in the program mode and supplying the programmed data to the bit lines in the read mode, each word-line driver separately comprising:
    a first node;
    a second node;
    a wiring pattern having a first configuration coupling the first node to the second node and a second configuration disconnecting the first node from the second node, one of the first and second configurations being used responsive to a fabrication mask option selected according to the specified voltage;
    a first transistor coupling the first node to the power supply, the first transistor having a grounded substrate electrode, the first transistor turning on when the word-line driver is selected and supplying the specified voltage to the first node with a predetermined voltage drop;

a second transistor coupling the first node to ground, the second transistor turning off when the word-line driver is selected;

a third transistor coupling the second node to the power supply, the third transistor turning on when the word-line driver is selected and supplying the specified voltage to the second node; and a fourth transistor coupling the first node to one of the word lines, the fourth transistor turning on in the read mode and turning off when the word-line driver is selected in the program mode.

9. The programmable read-only memory of claim 8, wherein the first transistor is an n-channel enhancement-mode metal-oxide-semiconductor transistor.

10. The programmable read-only memory of claim 9, wherein the third transistor is a p-channel enhancement-mode metal-oxide-semiconductor transistor.

11. The programmable read-only memory of claim 10, wherein the fourth transistor is a depletion-mode metal-oxide-semiconductor transistor.

12. A programmable read-only memory supplied with power at a specified voltage, receiving a control signal, operating in a program mode and a read mode as selected by the control signal, having word lines, bit lines, memory cells disposed at intersections of the word lines and the bit lines, an address decoder that receives an address signal and generates decoded address signals, and a plurality of word-line drivers that drive the word lines according to the decoded address signals, thereby selecting the memory cells, the selected memory cells being programmed with data from the bit lines in the program mode and supplying the programmed data to the bit lines in the read mode, each word-line driver separately comprising:

a transistor having a source electrode, a gate electrode, and a drain electrode, using the source electrode and the drain electrode to supply one of the decoded address signals to one of the word lines, the transistor being a depletion-mode metal-oxide-semiconductor transistor if the specified voltage has a first value, and an enhancement-mode metal-oxide-semiconductor transistor if the specified voltage has a second value, the transistor thereby supplying said one of the decoded address signals to said one of the word lines with unchanged voltage if the specified voltage has the first value, and with a voltage drop if the specified voltage has the second value; and a logic circuit receiving the control signal and said one of the decoded address signals, generating a logic output signal, and supplying the logic output signal to the gate electrode of the transistor, causing the transistor to turn on in the read mode, and to turn on and off according to said one of the decoded address signals in the program mode.

13. The programmable read-only memory of claim 12, wherein the transistor is an n-channel transistor.

14. The programmable read-only memory of claim 13, wherein the logic circuit comprises:

an inverter receiving the control signal and generating an inverted control signal; and a NAND gate receiving the inverted control signal and said one of the decoded address signals and generating the logic output signal.

15. A programmable read-only memory supplied with power at a specified voltage, receiving a control signal, operating in a program mode and a read mode as selected by the control signal, having word lines, bit lines, memory cells disposed at intersections of the word lines and the bit lines, an address decoder that receives an address signal and generates decoded address signals, and a plurality of word-line drivers that drive the word lines according to the decoded address signals, thereby selecting the memory cells, the selected memory cells being programmed with data from the bit lines in the program mode and supplying the programmed data to the bit lines in the read mode, each word-line driver separately comprising:

a transistor having a source electrode, a gate electrode, and a drain electrode, using the source electrode and the drain electrode to supply one of the decoded address signals to one of the word lines, the transistor being a depletion-mode metal-oxide-semiconductor transistor if the specified voltage has a first value, and an enhancement-mode metal-oxide-semiconductor transistor if the specified voltage has a second value, the transistor thereby supplying said one of the decoded address signals to said one of the word lines with unchanged voltage if the specified voltage has the first value, and with a voltage drop if the specified voltage has the second value; and a wiring circuit having a configuration selected by a fabrication mask option according to the specified voltage, the wiring circuit supplying the control signal to the gate electrode of the transistor if the specified voltage has the first value, and supplying a predetermined voltage to said gate electrode if the specified voltage has the second value, thereby causing the transistor to turn on in the read mode, and to turn on and off according to said one of the decoded address signals in the program mode.

16. The programmable read-only memory of claim 15, wherein the transistor is an n-channel transistor.

17. The programmable read-only memory of claim 15, wherein the predetermined voltage has the second value.

18. The programmable read-only memory of claim 15, further comprising a constant-voltage source generating the predetermined voltage.

19. The programmable read-only memory of claim 18, wherein the predetermined voltage has a value lower than the second value.

* * * * *